United States Patent
Schreiber et al.

(10) Patent No.: US 10,043,572 B1
(45) Date of Patent: Aug. 7, 2018

(54) VSS BITCELL SLEEP SCHEME INVOLVING MODIFIED BITCELL FOR TERMINATING SLEEP REGIONS

(71) Applicant: Advanced Micro Devices, Inc., Sunnyvale, CA (US)

(72) Inventors: Russell Schreiber, Austin, TX (US); John J. Wuu, Fort Collins, CO (US); Keith Kasprak, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 15/663,096

(22) Filed: Jul. 28, 2017

(51) Int. Cl.
| | |
|---|---|
| G11C 11/40 | (2006.01) |
| G11C 11/419 | (2006.01) |
| G11C 11/418 | (2006.01) |
| G11C 5/14 | (2006.01) |
| G11C 5/06 | (2006.01) |

(52) U.S. Cl.
CPC ............. G11C 11/419 (2013.01); G11C 5/14 (2013.01); G11C 5/148 (2013.01); G11C 11/418 (2013.01); G11C 5/063 (2013.01)

(58) Field of Classification Search
CPC ......... G11C 11/418; G11C 5/06; G11C 5/063; G11C 5/14; G11C 5/148
USPC ...................... 365/154, 210.1, 226, 227, 229
See application file for complete search history.

(56) References Cited

U.S. PATENT DOCUMENTS

| | | | | |
|---|---|---|---|---|
| 4,977,542 | A * | 12/1990 | Matsuda | G11C 7/14 365/149 |
| 7,933,760 | B2 | 4/2011 | Schreiber et al. | |
| 7,940,580 | B2 | 5/2011 | Schreiber et al. | |
| 9,257,199 | B2 | 2/2016 | Schreiber | |
| 2009/0116318 | A1* | 5/2009 | Kuroda | G11C 7/08 365/200 |
| 2011/0211383 | A1* | 9/2011 | Russell | G11C 7/02 365/148 |

* cited by examiner

*Primary Examiner* — Tan T. Nguyen
(74) *Attorney, Agent, or Firm* — Rory D. Rankin; Meyertons, Hood, Kivlin, Kowert & Goetzel, P.C.

(57) ABSTRACT

A system and method for providing efficient power, performance and stability tradeoffs of memory accesses are described. A computing system uses a memory for storing data, and a processing unit, which generates access request. The memory stores data and includes a dummy cell between a first region and a second region. The first region and the second region operate with at least one of two operating states such as an awake state and a sleep state. The dummy cell uses two ground connections to support two separate ground references. In one example, a first ground reference is zero volts and a second ground reference is a floating node. In another example, the first ground reference is a value shared by one of the two regions and the second ground reference is the floating node.

17 Claims, 8 Drawing Sheets

VSS BITCELL SLEEP SCHEME INVOLVING MODIFIED BITCELL FOR TERMINATING SLEEP REGIONS

BACKGROUND

Description of the Relevant Art

Generally speaking, a variety of semiconductor chips include at least one processing unit coupled to a memory. The processing unit processes instructions by fetching instructions and data, decoding instructions, executing instructions, and storing results. The processing unit sends memory access requests to the memory for both fetching instructions and data and storing results of computations. For semiconductor chips with multiple processing units, the demand for memory increases. A larger amount of memory provides both sufficient storage for each processing unit and sharing of more information across the multiple processing units.

In some embodiments, the processing unit and the memory are on a same die. In other embodiments, the processing unit and the memory are on different dies within a same package such as a system-on-a-chip (SOC). Static random access memory (SRAM) is commonly used for the memory. The SRAM includes an array of many bit cells and a logic portion used for accessing values stored in the array.

In order to balance performance, power consumption, and bit cell stability of the SRAM, multiple design techniques are used. One such technique is using multiple power supplies to reduce power consumption, balance the timing of the read and write operations, and improve noise margins. As transistor sizes decrease, the threshold voltages of the transistors variation increases. The bit cell in an SRAM often uses transistors in pairs, and it is desirable to have the threshold voltage of each transistor in the pair to be very close to the same value. A wide variation in threshold voltages between a pair of transistors reduces performance and/or causes it to lose state. Using different voltage supplies serves to balance tradeoffs between performance, power consumption, and stability of the SRAM bit cell.

While using multiple power supplies to the bit cells has some advantages, this technique does not reduce leakage current from the bit line precharge device through a bit cell passgate to the ground terminal. Likewise, an appreciable amount of leakage current remains in the cross coupled inverters in the bit cell.

In view of the above, efficient methods and systems for providing efficient power, performance and stability tradeoffs of memory accesses are desired.

BRIEF DESCRIPTION OF THE DRAWINGS

The advantages of the methods and mechanisms described herein may be better understood by referring to the following description in conjunction with the accompanying drawings, in which.

Figure 1:
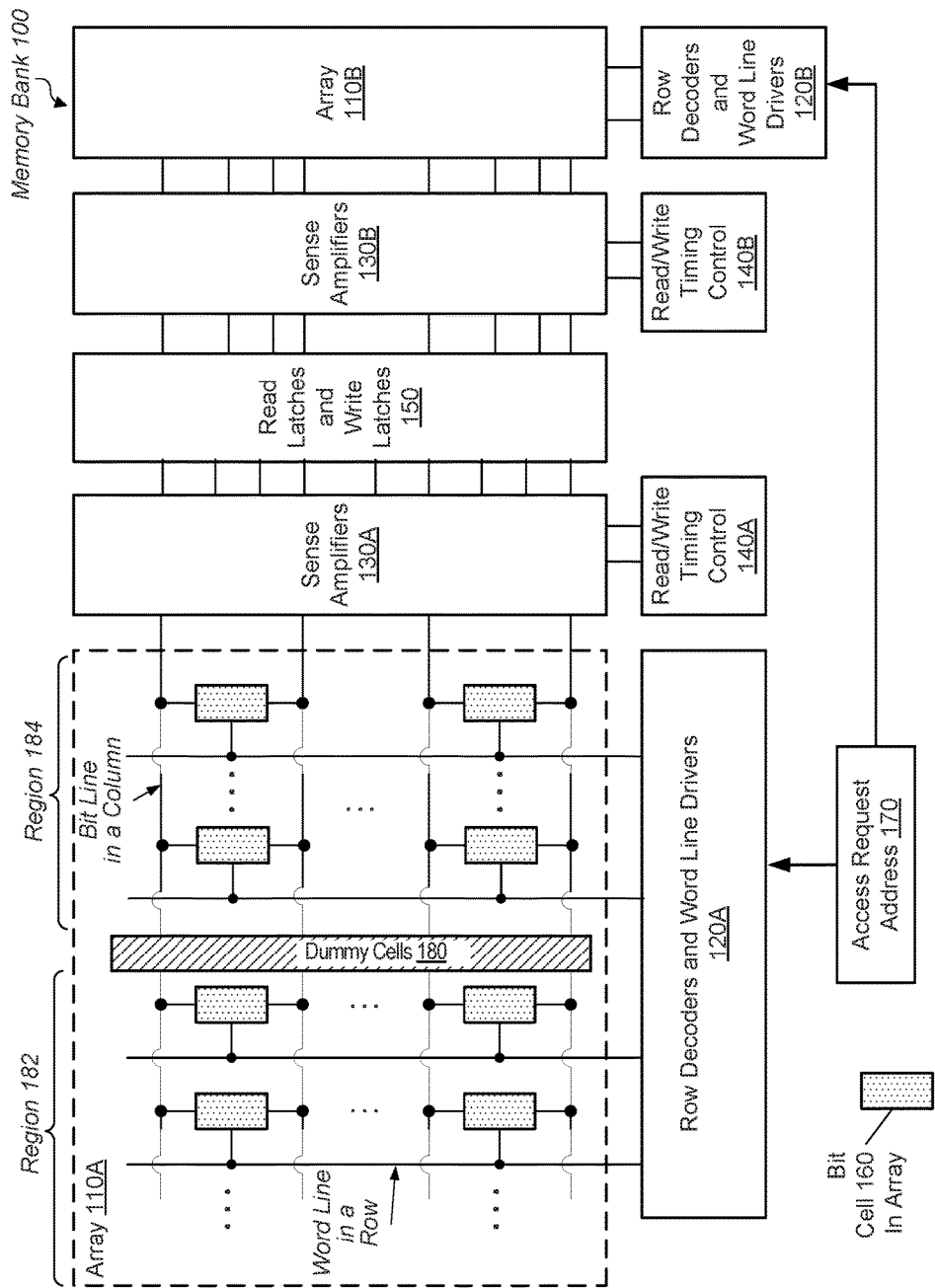
FIG. 1 is a generalized block diagram of one embodiment of a memory bank.

While the invention is susceptible to various modifications and alternative forms, specific embodiments are shown by way of example in the drawings and are herein described in detail. It should be understood, however, that drawings and detailed description thereto are not intended to limit the invention to the particular form disclosed, but on the contrary, the invention is to cover all modifications, equivalents and alternatives falling within the spirit and scope of the present invention as defined by the appended claims.

DETAILED DESCRIPTION

In the following description, numerous specific details are set forth to provide a thorough understanding of the present invention. However, one having ordinary skill in the art should recognize that the invention might be practiced without these specific details. In some instances, well-known circuits, structures, and techniques have not been shown in detail to avoid obscuring the present invention.

Systems and methods for providing efficient power, performance and stability tradeoffs of memory accesses are contemplated. In various embodiments, a computing system uses a memory for storing data, and a processing unit, which generates access requests for the data stored in the memory while processing instructions of a given algorithm. In addition, the computing system uses a system management unit for determining operating states for various components and an operation regulator for adjusting the operating parameters for the components based on indications received from the system management unit.

The memory includes multiple rows for storing the data with each intersection of a row and a column being a memory bit cell. In some embodiments, each one of the memory bit cells is a copied variation of a six-transistor random access memory (RAM) cell selected based on design needs. In other embodiments, another one of various types of RAM cells is used. In various embodiments, the memory uses multiple regions with a dummy cell between two neighboring regions.

In some embodiments, the system management unit determines independent operating states for the first region and the second region. For example, each of the first region and the second region in a memory row is able to operate in at least an awake state and a sleep state. When the operation regulator receives an indication from the system management unit of an awake state for the first region, the operation regulator selects a zero value to be used as a ground reference for the first region. When the operation regulator receives an indication from the system management unit of a sleep state for the first region, the operation regulator selects a positive nonzero value less than the power supply voltage but low enough to keep cell within retention voltage limit to be used as the ground reference for the first region. Similar steps are performed for the second region.

In various embodiments, the dummy cell placed between the first region and the second region uses a memory bit cell similar to the memory bit cells used for the storage and access of bits in the first region and the second region. However, the dummy cell uses two ground connections. In an embodiment, a first ground reference is a value of zero and a second ground reference is a floating node. In some embodiments, the word line of the memory cell within the dummy cell is connected to a zero value, which turns off the pass gates within the memory bit cell. The first half of the memory cell within the dummy cell uses the first ground reference, which is the zero value. The second half of the memory cell within the dummy cell uses the second ground reference, which is the floating node. Therefore, despite any noise or leakage current, the memory bit cell resolves to full power rail values such as the current operational voltage supply and the zero value for the ground reference. Since there are no mid-rail signals driving one of the cross coupled inverters, there is no short circuit path for appreciable current draw, which would greatly increase power consumption.

Turning now to FIG. 1, a generalized block diagram of one embodiment of a memory bank 100 for storing data is shown. In various embodiments, a memory block includes both a left bank and a right bank. The bank 100 is a left bank or a right bank of the memory block. In various embodiments, the memory bank 100 is used for a rectangular-shaped or square-shaped memory block. As shown, the memory bank 100 includes arrays 110A-110B, row decoders 120A-120B, sense amplifiers 130A-130B between the arrays 110A-110B, read and write timing control logic 140A-140B, and read latches and write latches in block 150. In various embodiments, each of the blocks 110A-110B, 120A-120B, 130A-130B, 140A-140B and 150 in the memory bank 100 is communicatively coupled to another one of the blocks. For example, direct connections are used wherein routing occurs through another block. Alternatively, staging of signals is done in an intermediate block.

In various embodiments, each of the arrays 110A-110B includes multiple memory bit cells 160 arranged in a tiled format. In some embodiments, each one of the memory bit cells is a copied variation of a six-transistor RAM cell selected based on design needs. In other embodiments, another one of various types of RAM cells is used. Each of the arrays 110A-110B includes multiple rows for storing the data with each intersection of a row and a column being one of the memory bit cells 160. In the embodiment shown, the columns in the arrays 110A-110B are arranged in a horizontal orientation. Each of the multiple bit cells in a given column share one or more bit lines. Additionally, the rows, or entries, in the arrays 110A-110B are arranged in a vertical orientation in the illustrated embodiment. Each of the multiple bit cells in a given row, or a given entry, shares a word line. In some embodiments, each column has at least two regions, each with an independent operating state such as an awake state and a sleep state. In various embodiments, one or more of the arrays 110A-110B use dummy cells 180 between two regions. For example, the array 110A has region 182 and region 184 with dummy cells 180 located between them. Although two regions are shown in the illustrated embodiment, in other embodiments, another number of regions are possible and contemplated.

In various embodiments, one or more dummy cells of the dummy cells 180 are placed between the region 182 and region 184 in the array 110A. In some embodiments, a dummy cell uses a memory bit cell similar to memory bit cells 160 that are used for the storage and access of bits in region 182 and region 184. For example, in an embodiment, a dummy cell in the dummy cells 180 uses a six transistor RAM cell. In various embodiments, each half of back-to-back inverters of a given memory bit cell 160 in region 182 uses a same ground connection. Similarly, in various embodiments, each half of the back-to-back inverters of a given memory bit cell 160 in region 184 uses a same ground connection, which is different from the ground connection in region 182 when the regions 182 and 184 have different operating states (e.g., awake and sleep). In contrast, in various embodiments, a given dummy cell of the dummy cells 180 uses two separate ground connections.

In some embodiments, the first half of the back-to-back inverters of a given dummy cell of the dummy cells 180 uses a first ground connection, while the second half of the back-to-back inverters of the given dummy cell uses a second ground connection different from the first ground connection. As further described later, in an embodiment, the first ground connection for the first half of the given dummy cell uses the zero volt ground reference. In another embodiment, the first ground connection of the given dummy cell shares the same ground reference as one region of the region 182 and the region 184. The separate second ground connection for the second half of the given dummy cell uses a floating node as the ground reference. Therefore, because of noise and/or leakage current, the given dummy cell of the dummy cells 180 resolves to full power rail values such as the current operational voltage supply and the zero value for the ground reference. Since there are no mid-rail signals driving one of the cross coupled inverters in the given dummy cell of the dummy cells 180, there is no short circuit path for appreciable current draw.

During operation, in one example, region 182 of the array 110A is in an awake state while region 184 is in a sleep state. In another example, the states are reversed where region 182 of the array 110A is in a sleep state while region 184 is in an awake state. In other examples, both region 182 and region 184 have a same operating state which is one of the awake state and the sleep state. Any of a variety of methods are used to determine the operating state for each of the region 182 and region 184. In some embodiments, control logic (not shown) within the memory bank 100 or within the memory using the memory bank 100 determines the operating state. In other embodiments, an external system management unit determines operational parameters and operating states for various components such as region 182 and region 184 in the array 110A.

In some embodiments, the arrays 110A-110B forego using multiple power supply values, and instead, the arrays 110A-110B use multiple values for ground connections such as an additional sleep ground reference. In other embodiments, the arrays 110A-110B use both multiple power supply values and multiple ground reference values. In an embodiment, a non-zero voltage, which is also referred to as a sleep ground reference, is used in addition to a zero volt ground reference. For example, when region 182 in the illustrated embodiment is in an awake state, each of the memory bit cells 160 in region 182 uses the zero volt ground reference as the ground connection, which is also referred to as VSS. Similar to the power supply connection, in some embodiments, this ground connection is a programmable value.

Figure 2:
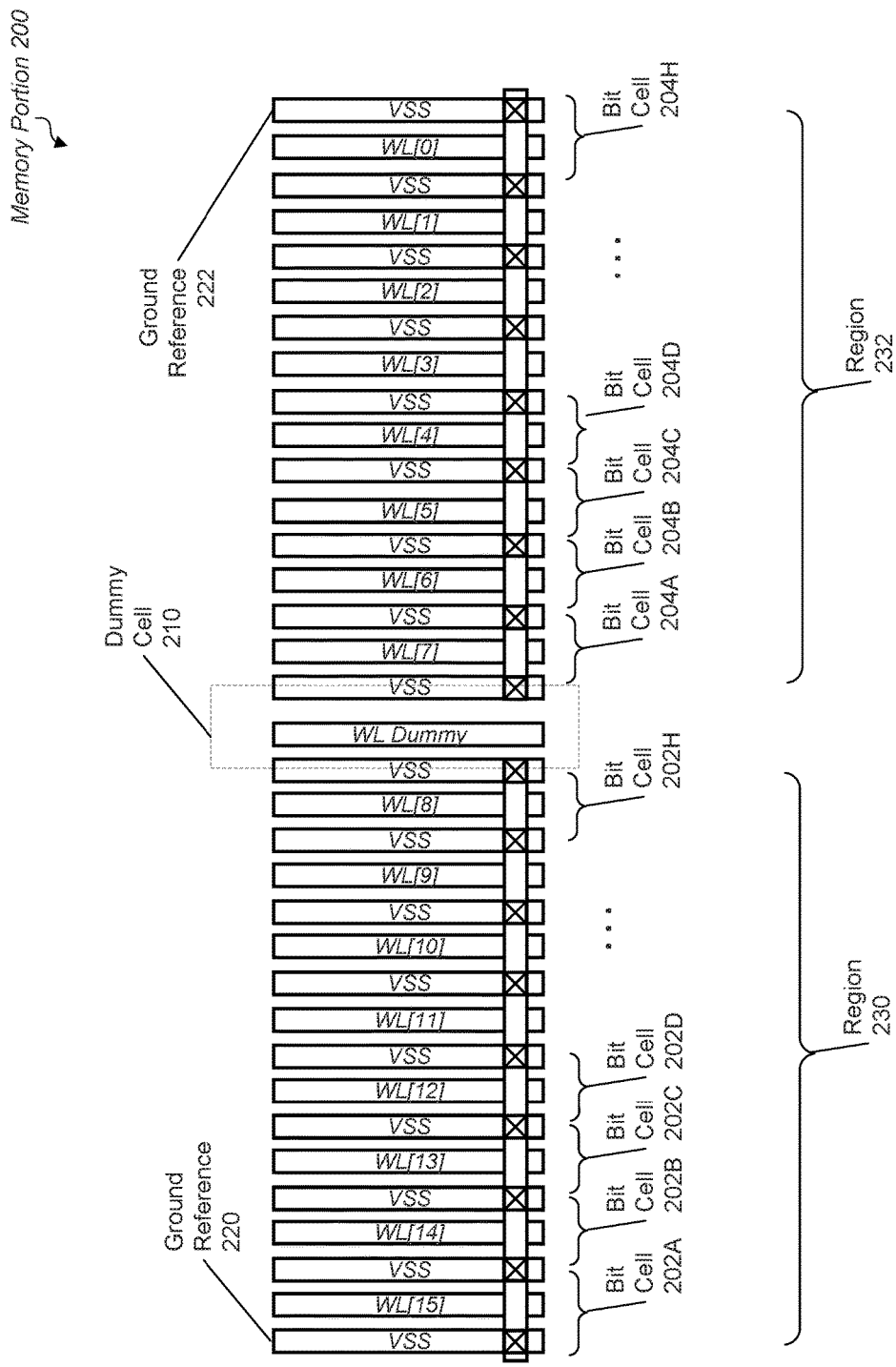
FIG. 2 is a generalized block diagram of one embodiment of a memory portion with a dummy cell placed between two regions.
Figure 3:
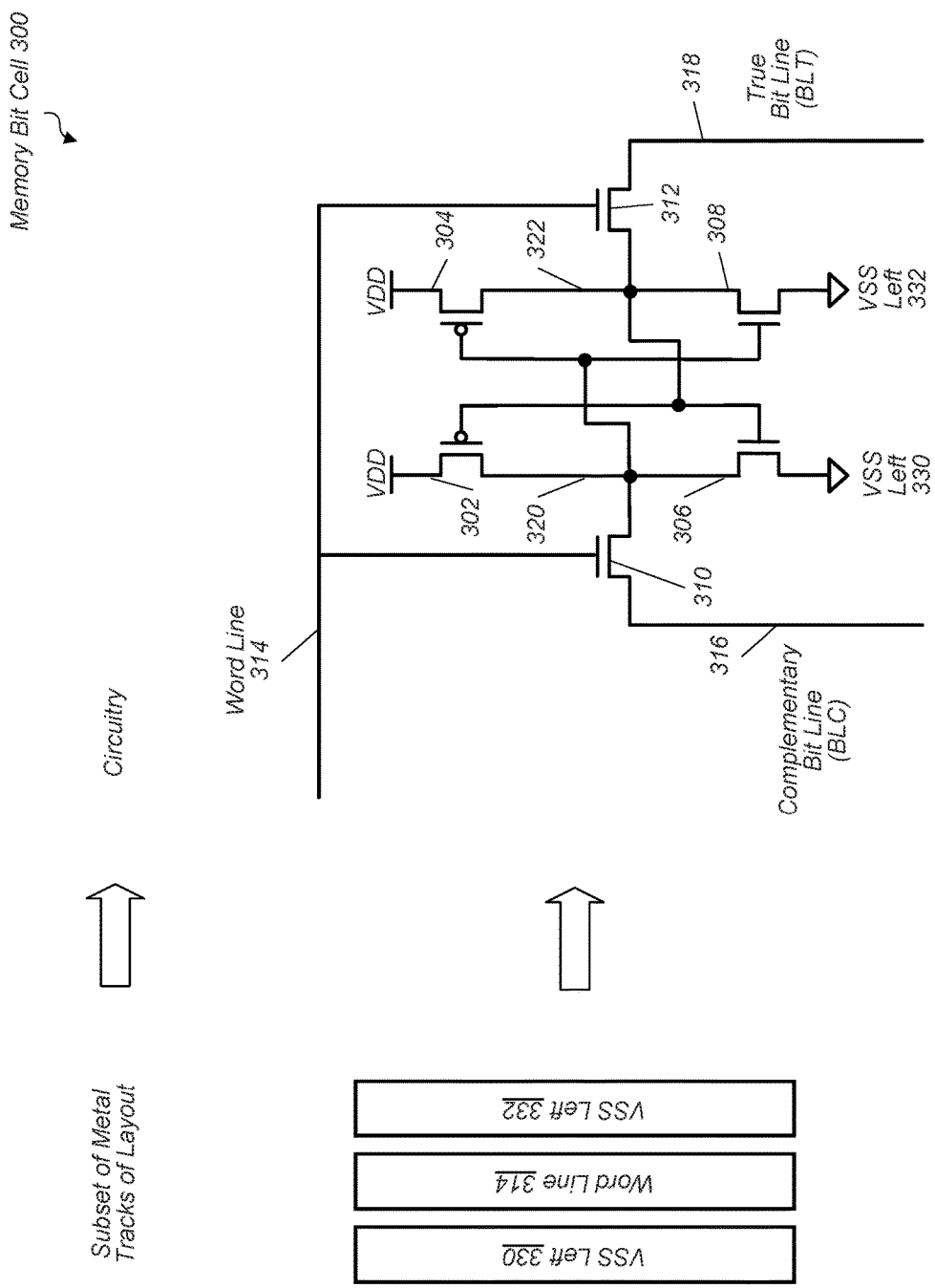
FIG. 3 is a generalized block diagram of one embodiment of a memory bit cell used within a region in a memory array.
Figure 4:
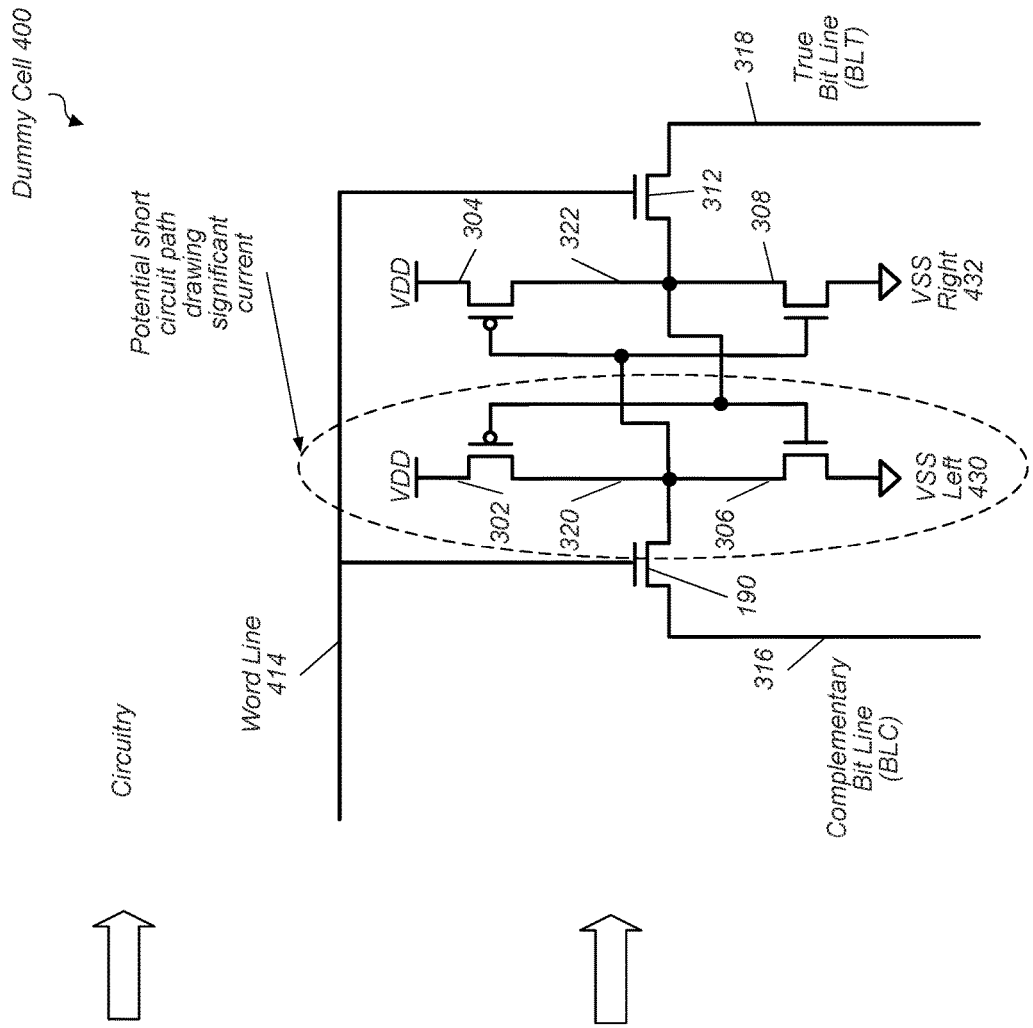
FIG. 4 is a generalized block diagram of one embodiment of a dummy cell for terminating sleep regions.
Figure 4:
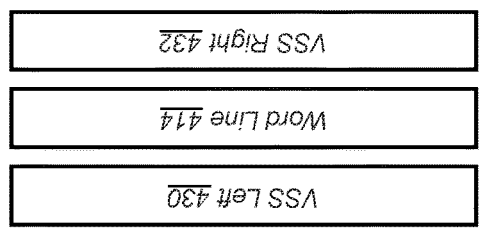
Figure 5:
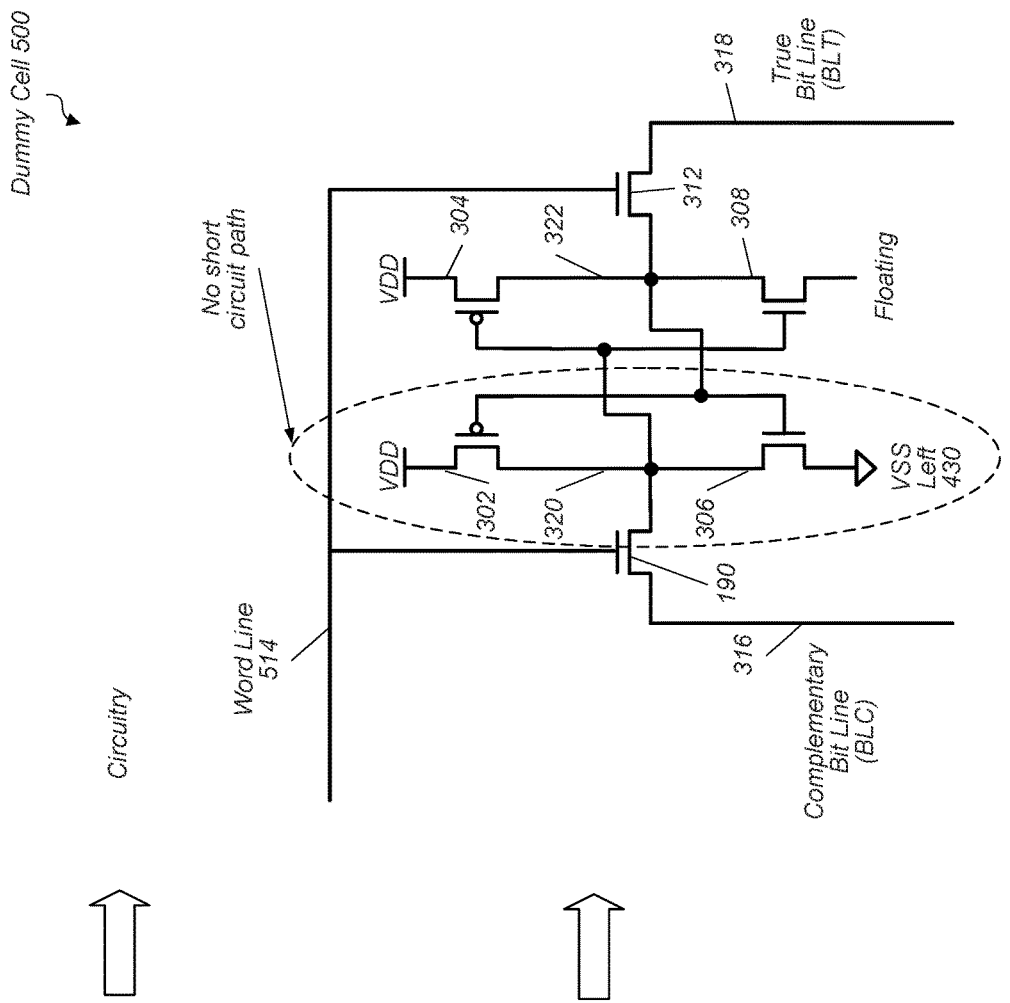
FIG. 5 is a generalized block diagram of another embodiment of a dummy cell for terminating sleep regions where the dummy cell prevents a short circuit path.
Figure 6:
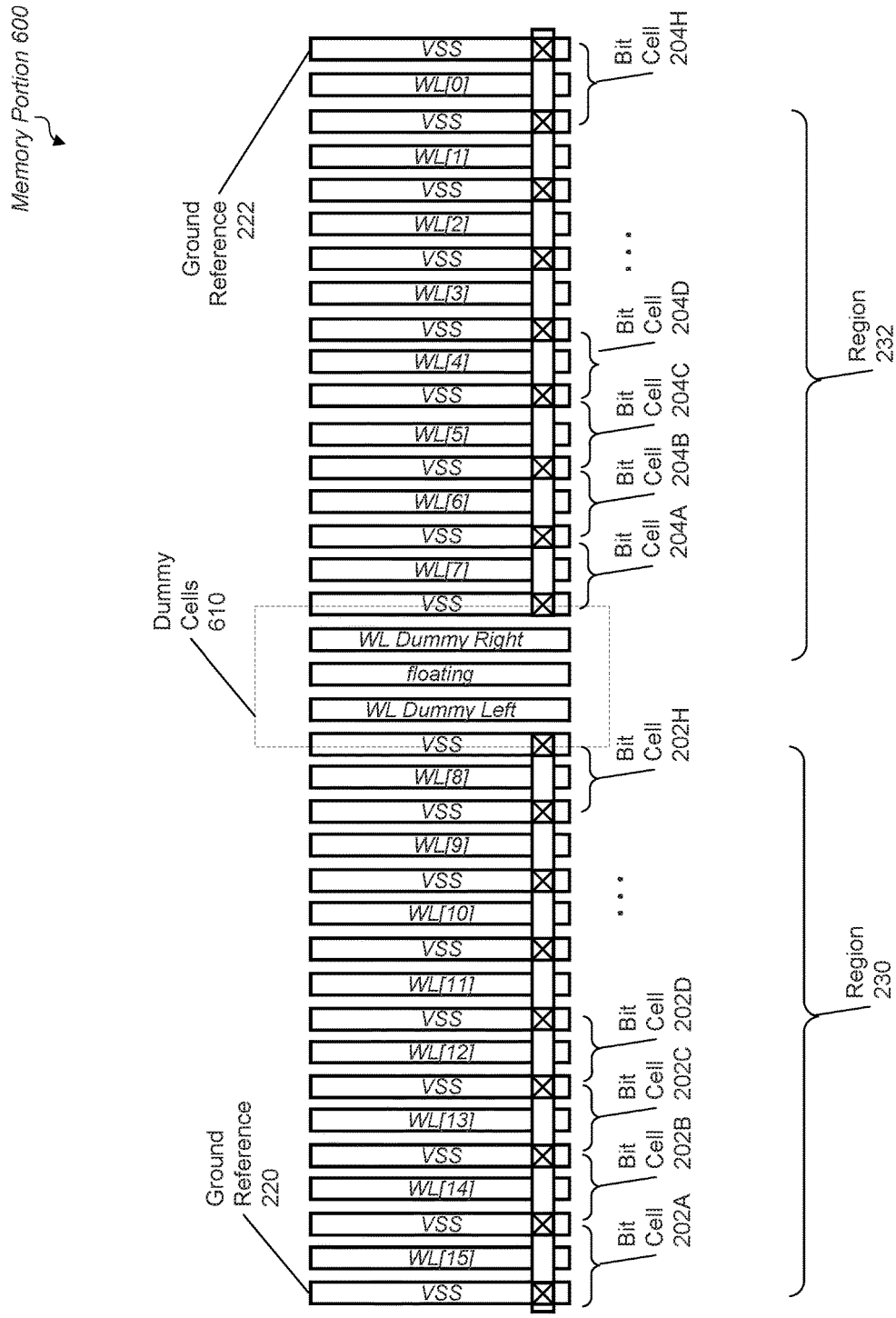
FIG. 6 is a generalized block diagram of another embodiment of a memory portion with a dummy cell placed between two regions where the dummy cell prevents a short circuit path.

When the region 182 in the illustrated embodiment is in a sleep state, each of the memory bit cells 160 in region 182 uses the non-zero volt (V) ground reference, which is the sleep ground reference. In various embodiments, the non-zero voltage is between zero and the current operational voltage supply. The use of the two ground references in region 182 also occurs in region 184 in various embodiments. Before continuing with a further description of the dummy cells 180, the remainder of the components of the memory bank 100 and the operation of the memory bank 100 is provided. In addition, the upcoming FIG. 2 illustrates one embodiment of a memory portion with a dummy cell placed between two regions. FIG. 3 illustrates one embodiment of a memory bit cell. FIG. 4 illustrates one embodiment of a dummy cell. FIG. 5 illustrates another embodiment of a dummy cell, which prevents a short circuit path and the corresponding appreciable current draw. FIG. 6 illustrates another embodiment of a memory portion with a dummy cell placed between two regions where the dummy cell prevents the short circuit path. Here, for FIG. 1, the remainder of the components of the memory bank 100 and the operation of the memory bank 100 is provided in the following description.

The row decoders and word line drivers in blocks 120A-120B receive address information corresponding to an access request. For example, each of the blocks 120A-120B receives the information provided by the access request address 170. Each one of the blocks 120A-120B selects a particular row, or entry, of the multiple rows in an associated one of the arrays 110A-110B. In some embodiments, the blocks 120A-120B use an index portion of the address 170 for selecting a given row, or entry, in an associated one of the arrays 110A-110B. Each row, or entry, stores one or more memory lines. For write access requests, the write latches are located in block 150. The write data is driven into the arrays 110A-110B. The timing control logic 140a-140B sets up the write word line driver logic and updates the write latches with new data in block 150.

The write data is written into a row of bit cells that is selected by an associated one of the blocks 120A-120B. In some embodiments, precharge circuitry is included in block 150.

For read access requests, the block 150 is used to precharge the read lines routed to the arrays 110A-110B. The timing logic in blocks 140A-140B is used for precharging and setting up the sense amplifiers in the blocks 130A-130B. The timing control logic 140A-140B sets up the read word line driver logic and a selected row selected by an associated one of the row decoders 120A-120B provides its data on the read lines, which are sensed by the sense amplifiers. The read latches capture the read data. For each of the write access requests and read access requests, the selected row has certain bit cells selected for completion of the access request. In various embodiments, bit separation, which is also referred to as bit interleaving, is used to protect against soft errors.

Referring to FIG. 2, a generalized block diagram of one embodiment of a memory portion 200 with a dummy cell placed between two regions is shown. Again, the memory bit cells in a given memory column share one or more bit lines in the array of the memory. In the embodiment shown, the memory portion 200 uses region 230 and region 232 with a dummy cell 210 placed between the two regions 230 and 232. Although two regions are shown in the illustrated embodiment, in other embodiments, another number of regions are possible and contemplated. The dummy cell 210 is used for terminating regions 230 and 232. Region 230 in the memory portion 200 uses memory bit cells 202A-202H and region 232 uses memory bit cells 204A-204H. In the illustrated embodiment, the memory portion 200 includes 16 bits. Region 230 includes bit cells from the 8 memory lines [15:8] and region 232 includes bit cells from the 8 memory lines [7:0]. However, in other embodiments, any of a variety of a number of bit cells is used. In an embodiment, region 230 uses the ground reference 220 and the region 232 uses the separate ground reference 232.

A subset of metal tracks used in the layout of any one of the memory bit cells 202A-202H and 204A-204H is shown. In an embodiment, each of the memory bit cells 202A-202H and 204A-204H uses at least three vertical metal tracks for two ground references and a word line signal. Although a vertical orientation is shown, in other embodiments, these tracks are used in a horizontal orientation. The first track shown is for the first ground reference, a second track is for the word line input, and a third track is for the second ground reference. For example, the memory bit cell 202A uses a left VSS track for the ground reference 220, a word line track for the signal WL[15], and a right VSS track for the ground reference 220. A track is shown being used to connect each of the VSS tracks together for region 230 to the ground reference 220. Similarly, a track connects each of the VSS tracks together for region 232 to the ground reference 222. In the illustrated embodiment, the tracks used for connecting VSS tracks use a horizontal orientation, which is the orientation of the memory portion 200.

The values used for the ground references 220 and 222 are based on operating states for the regions 230 and 232. As described earlier, in one example, region 230 is in an awake state while region 232 is in a sleep state. When the region 230 is in an awake state, the ground reference 220 is set to a zero volt reference value which is provided to each of the memory bit cells 202A-202H. When the region 232 is in a sleep state, the ground reference 222 is set to a non-zero voltage reference value which is provided to each of the memory bit cells 204A-204H. In another example, the states are reversed where region 230 is in a sleep state and the ground reference 220 provides a non-zero voltage reference value to each of the memory bit cells 202A-202H while region 232 is in an awake state and the ground reference 222 provides a zero voltage reference value to each of the memory bit cells 204A-204H. In other examples, both regions 230 and 232 have a same operating state which is one of the awake state and the sleep state.

In the illustrated embodiment, the dummy cell 210 shares the ground references 220 and 222. In an embodiment, the word line input for the dummy cell 210 is connected to a third ground reference which is a zero voltage reference value. Since the dummy cell 210 shares the ground references 220 and 222, a short circuit path exists in the dummy cell 210 which draws an appreciable amount of current if one region is awake and the other is asleep. This dummy cell 210 is replaced with another dummy cell which uses a floating node for one of the ground references. Before a further description of the new second dummy cell is provided in FIG. 5, a further description of the circuitry for both a memory bit cell of the memory bit cells 202A-202H and 204A-204H is provided in FIG. 3 and a further description of circuitry for the first dummy cell 210 is first provided in FIG. 4.

Turning now to FIG. 3, a generalized block diagram of one embodiment of a memory bit cell 300 used within a region in a memory array is shown. In the embodiment shown, data storage is provided by the memory bit cell 300, which uses a variation of the six-transistor (6T) random access memory (RAM) cell. In other embodiments, another one of various types of RAM cells is used. In an embodiment, the memory bit cell 300 is copied many times and arranged in an array of rows and columns for a memory. As described earlier, the memory includes external logic (not shown) such as row decoders, column decoders, a sense amplifier and latches for storing read and write access data. Further, in some embodiments, external control logic is placed in a system management unit for selecting operational parameters for the memory such as at least a power supply voltage, a ground reference voltage, and a clock frequency. An operation regulator receives indications from the system management unit during operation of the memory and adjusts the operational parameters when appropriate.

In the illustrated embodiment, a subset of metal tracks used in the layout of the memory bit cell 300 is shown. As shown, the memory bit cell 300 uses at least three vertical metal tracks for two ground references and a word line signal. Although a vertical orientation is shown, in other embodiments, these tracks are used in a horizontal orientation. The first track shown is for the first ground reference VSS Left 330, a second track is for the word line 314, and a third track is for the second ground reference VSS Left 332, which is electrically shorted to the first track as described earlier. The "Left" in the names indicates the memory bit cell 300 is used in a left region of multiple regions of a memory row. Another nomenclature, such as "Right," "Top," "Bottom," or other is possible and contemplated. In any case, for a memory bit cell, the two tracks 330 and 332 are electrically shorted to one another. Nodes in circuitry corresponding to the three tracks are shown in the figure on the right. The word line input 314 is used to turn on and off the pass gate n-type metal oxide semiconductor (MOS) field effect transistors (FETs) 310 and 312. The ground references 330 and 332 are used to reduce power consumption and are tied to the two pulldown NMOS transistors 306 and 308.

As described earlier, in some embodiments, each column of the memory uses multiple regions with a dummy cell placed between two neighboring regions. In other embodiments, each row of the memory uses multiple regions with a dummy cell placed between two neighboring regions. In some embodiments, the memory uses multiple values for ground connections such as an additional sleep ground reference. In an embodiment, a non-zero voltage, which is also referred to as a sleep ground reference, is used in addition to a zero voltage ground reference. Using an additional sleep ground reference reduces leakage current from the bit line precharge device through a bit cell pass gate (transistors 310 and 312) to the ground terminal in addition to reducing the leakage current in the cross coupled inverters (transistors 302-308) in the memory bit cell 300.

The memory bit cell 300 utilizes p-type MOSFETs 302-304 and NMOS transistors 306-308 as a latching element. When the pass gates (NMOS transistors 310 and 312) are enabled by the word line input 314, the latching element has access to the bit lines 316 and 318. Although the memory bit cell 300 is shown as a single ported cell, in other embodiments, the memory bit cell 300 uses a multi-port design to provide parallel access operations for improved performance. When the transistors 302-308 of the latching element resolve the voltage level (data value) on the output nodes 320 and 322, which are drain terminals, the transistors 302-308 do not consume power besides leakage current power.

The data stored by the transistors 302-308 of the latching element is gated from the bit lines 316 and 318 by the NMOS transistors 310 and 312. The NMOS transistors 310 and 312 continue to block the stored data from the bit lines 316 and 318 until the word line input 314 is enabled by external access logic. The bit lines 316 and 318 are precharged by external circuitry.

The transistors 302-308 of the latching element amplify any voltage difference detected between the differential voltages on the bit lines 316 and 318 and resolve these voltages to full swing voltage values. The bit lines 316 and 318 are routed throughout a respective column of the array. In some embodiments, the bit lines 316 and 318 are also inputs to a sense amplifier (not shown) and read latches (not shown). In other embodiments, the bit lines 316 and 318 are inputs to dynamic logic.

The word line 314 is used to enable the NMOS transistors 310 and 312. The word line 314 is also connected to other 6T RAM cells of other macro cells in a corresponding row of the array. A row decoder (not shown) receives address information and enables a single row word line of many row word lines. When the address information indicates the word line 314 is to be enabled, the NMOS transistors 310 and 312 of each 6T RAM cell in the row are enabled and provide access for the transistors 302-308 of the latching element to the bit lines 316 and 318.

For read access operations, the external sense amplifier is enabled, the external read latches are enabled, and external precharge transistors are disabled. Therefore, the transistors 302-308 of the latching element are permitted to resolve the differential voltages on the bit lines 316 and 318 to full voltage swing values. For write access operations, a column decoder and write logic (not shown) select columns of the array and drive voltage values onto the bit lines 316 and 318 routed throughout a selected column in addition to disabling external precharge signals.

The transistors 302-308 of the latching element use the power supply designated as "VDD." In addition, the word line 314 is driven by the power supply VDD. As described earlier, the system management unit determines the value of VDD while transitioning the memory between different operating modes or states. In some embodiments, each operating mode is associated with one or more P-states. Control logic determines when each of region one and region two is in an awake state or a sleep state. For example, one or more of an on-die and an off-die power manager is used to determine power-performance states (P-states) and chip operating states (C-states) based on at least collected statistics during operation of the semiconductor chip. The value used by the ground references 330 and 332 is set by the determined operating state of the region using the memory bit cell 300.

Turning now to FIG. 4, a generalized block diagram of one embodiment of a dummy cell 400 for terminating sleep regions is shown. Circuitry and logic described earlier are numbered identically. As shown, the dummy cell 400 uses the type of RAM cell used by the memory bit cell 300, but the dummy cell 400 uses the word line input 414 and the ground references 430 and 432. A subset of metal tracks used in the layout of the dummy cell 400 is shown. As shown, the dummy cell 400 uses at least three vertical metal tracks for the two ground references 430 and 432 and the word line signal 414. Although a vertical orientation is shown, in other embodiments, these tracks are used in a horizontal orientation.

The ground references 430 and 432 are not electrically connected to one another. In an embodiment, the first track shown, which is used for the ground reference VSS Left 430, is electrically connected to a ground reference used by a region to the left of the dummy cell 400. The third track shown, which is used for the ground reference VSS Right 432, is electrically shorted to a ground reference used by a region to the right of the dummy cell 400. The "Left" and "Right" in the names indicates the dummy cell 400 is placed between a left region and a right region in a memory row. Another nomenclature, such as "Top," "Bottom," or other is possible and contemplated. In any case, the two tracks 430 and 432 are not electrically shorted to one another.

Nodes in circuitry corresponding to the three tracks are shown in the figure on the right. In an embodiment, the word line signal 414 is connected to a third ground reference which is a zero voltage reference value. In some embodiments, one or more of an on-die and an off-die power manager is used to determine power-performance states (P-states) and chip operating states (C-states), and the awake state and the sleep state are associated with the P-states and/or the C-states. The values for the ground references 430 and 432 are independently set based on selected states. In other embodiments, control logic within the memory determines whether a given region in the memory is in an awake state or a sleep state.

In an example, the left region is in an awake state, so the ground reference VSS Left 430 is a zero voltage reference value. The left half of the latch, which uses transistors 302 and 306, uses the ground reference 430. In contrast, the right region is in a sleep state, so the ground reference VSS Right 432 is a non-zero voltage reference value. The right half of the latch, which uses transistors 304 and 308, uses the ground reference 432. If node 320 has a logic high value, or node 320 is a logic low value which is greater than 0V due to VSS Right being >0, the pulldown transistor 308 is on and increases the voltage on the node 322 to VSS Right. Consequently, the pulldown transistor 306 is turned on while the pullup transistor 302 is also turned on. Now, current is drawn from the power supply VDD to the ground reference 430. This short circuit path is capable of drawing an appreciable amount of current.

Turning now to FIG. 5, a generalized block diagram of another embodiment of a dummy cell 500 for terminating sleep regions is shown. Circuitry and logic described earlier are numbered identically. As shown, the dummy cell 500 uses the word line input 514 and the ground reference 430 and a floating input for a second ground reference. A subset of metal tracks used in the layout of the dummy cell 500 is shown. As shown, the dummy cell 400 uses at least three vertical metal tracks for the two ground references 430 and the floating input and the word line signal 514. Although a vertical orientation is shown, in other embodiments, these tracks are used in a horizontal orientation.

Nodes in circuitry corresponding to the three tracks are shown in the figure on the right. In an embodiment, the word line signal 514 is connected to a third ground reference which is a zero voltage reference value. As described earlier, in an embodiment, the ground reference 430 is set based on a selected awake state or sleep state of the region to the left of the dummy cell 500. In another embodiment, the ground reference 430 is connected only to zero voltage reference value. The ground reference used by the pulldown transistor 308 is a floating input.

When the voltage value on the node 320 is a logic low value, the pulldown transistor 308 is turned off while the PMOS transistor 304 serially connected to it is turned on. Therefore, the voltage value on the node 322 is a logic high value. This voltage value is also placed on the gate terminal of the pulldown transistor 306, which is turned on while the PMOS transistor 302 serially connected to it is turned off. The pulldown transistor 306 pulls down the node 320 to its original logic low value.

In addition, if the ground connection for the pulldown transistor 306 becomes elevated from a logic low value, then the pulldown transistor 306, which is already turned on, pulls up the node 320 to the elevated value. Although the elevated value is now also placed on the gate terminal of the pulldown transistor 308, no current is drawn by the pulldown transistor 308 as its ground connection is floating. No short circuit path exists and no current is drawn from the power supply VDD to the ground reference 430 or any ground reference as the other ground references is a floating input.

In various embodiments, the dummy cell 500 is paired with another dummy cell with a same circuit configuration except the ground references for the pulldown transistors 306 and 308 are swapped. Therefore, the other dummy cell has the floating input placed on the pulldown transistor 306. In an embodiment, the pulldown transistor 308 for the other dummy cell has a zero voltage ground reference. In another embodiment, the pulldown transistor 308 for the other dummy cell is connected to the ground reference used by the region of the memory row placed on the right of the pair of dummy cells.

Referring to FIG. 6, a generalized block diagram of another embodiment of a memory portion 600 with a dummy cell placed between two regions where the dummy cell prevents a short circuit path is shown. Circuitry, signals and logic described earlier are numbered identically. Again, the memory bit cells in a given memory column share one or more bit lines in the array of the memory. In the embodiment shown, the memory portion 600 uses region 230 and region 232 with a pair of dummy cells 610 placed between the two regions 230 and 232. Although two regions are shown in the illustrated embodiment, in other embodiments, another number of regions are possible and contemplated. The dummy cells 610 are used for terminating regions 230 and 232. In an embodiment, the pair of dummy cells 610 uses a left dummy cell similar to the dummy cell 500 described earlier. In addition, the pair of dummy cells 610 uses a right dummy cell similar to the dummy cell 500 but with the ground references swapped. In some embodiments, each of the two word line inputs for the pair of dummy cells 610 are connected to one another and connected to a zero voltage ground reference. In an embodiment, each dummy cell of the pair of dummy cells 610 shares the floating input for a ground reference used by a respective circuitry implementing cross-coupled inverters.

Figure 7:
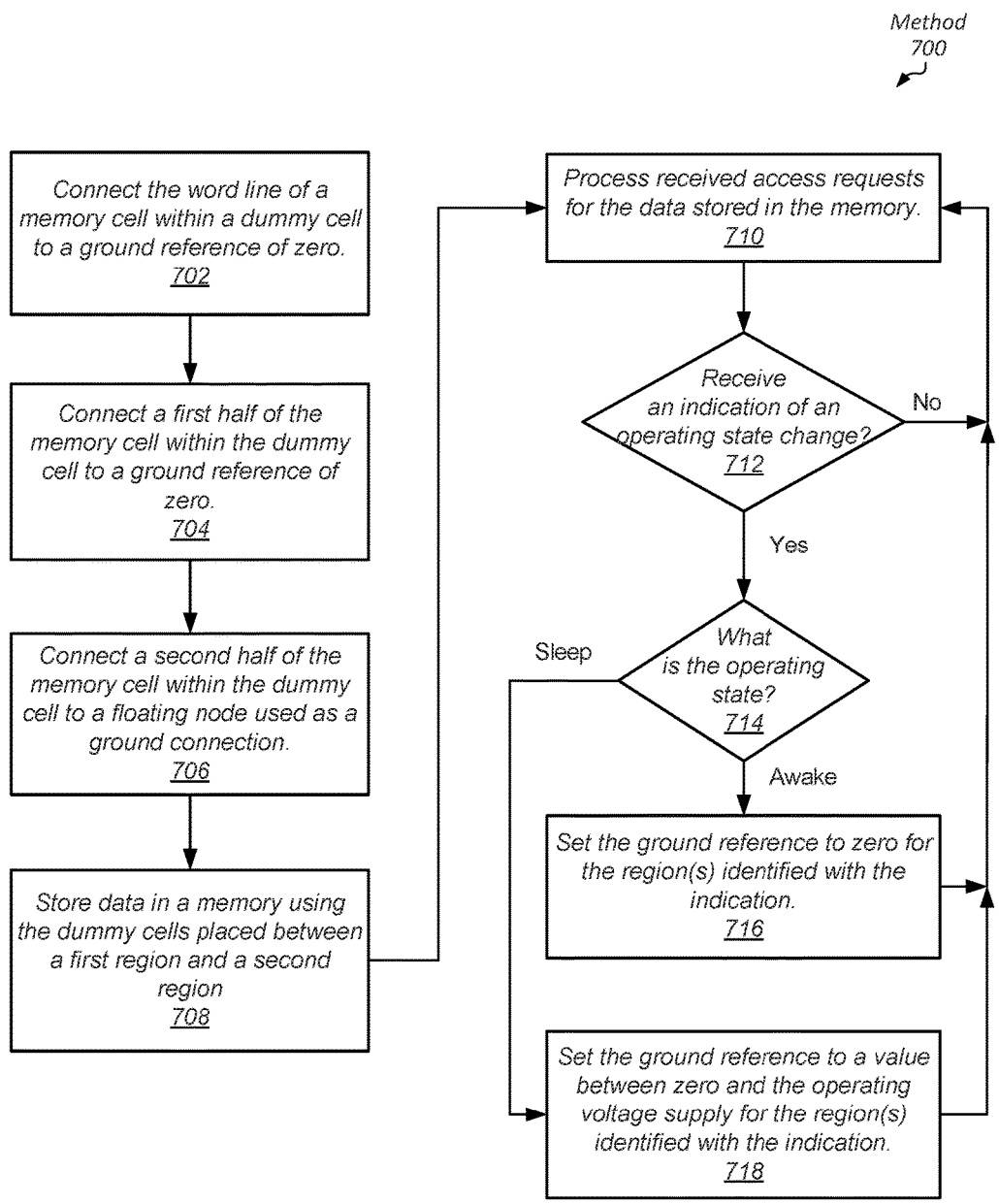
FIG. 7 is a generalized flow diagram of one embodiment of a method for providing efficient power, performance and stability tradeoffs of memory accesses.

Referring now to FIG. 7, a generalized flow diagram of one embodiment of a method 700 for providing efficient power, performance and stability tradeoffs of memory accesses is illustrated. For purposes of discussion, the steps in this embodiment are shown in sequential order. However, in other embodiments some steps occur in a different order than shown, some steps are performed concurrently, some steps are combined with other steps, and some steps are absent.

The word line of a memory cell within a dummy cell is connected to a ground reference of zero (block 702). A first half of the memory cell within the dummy cell is connected to a ground reference of zero (block 704). A second half of the memory cell within the dummy cell is connected to a floating node used as a ground connection (block 706). Data is stored in a memory. In various embodiments, a copy of the dummy cell is placed between two regions, each region including one or more bit cells (block 708).

Received access requests for the data stored in the memory are processed (block 710). If an indication of an operating state change is not received ("no" branch of the conditional block 712), then control flow of method 700 returns to block 710 where received memory access requests are processed. If an indication of an operating state change is received ("yes" branch of the conditional block 712), and the indication designates an awake state ("awake" branch of the conditional block 714), then the ground reference is set to zero for the region(s) identified with the indication (block 716). However, if the indication designates a sleep state ("sleep" branch of the conditional block 714), then the ground reference is set to a value between zero and the operating voltage supply for the region(s) identified with the indication (block 718).

Figure 8:
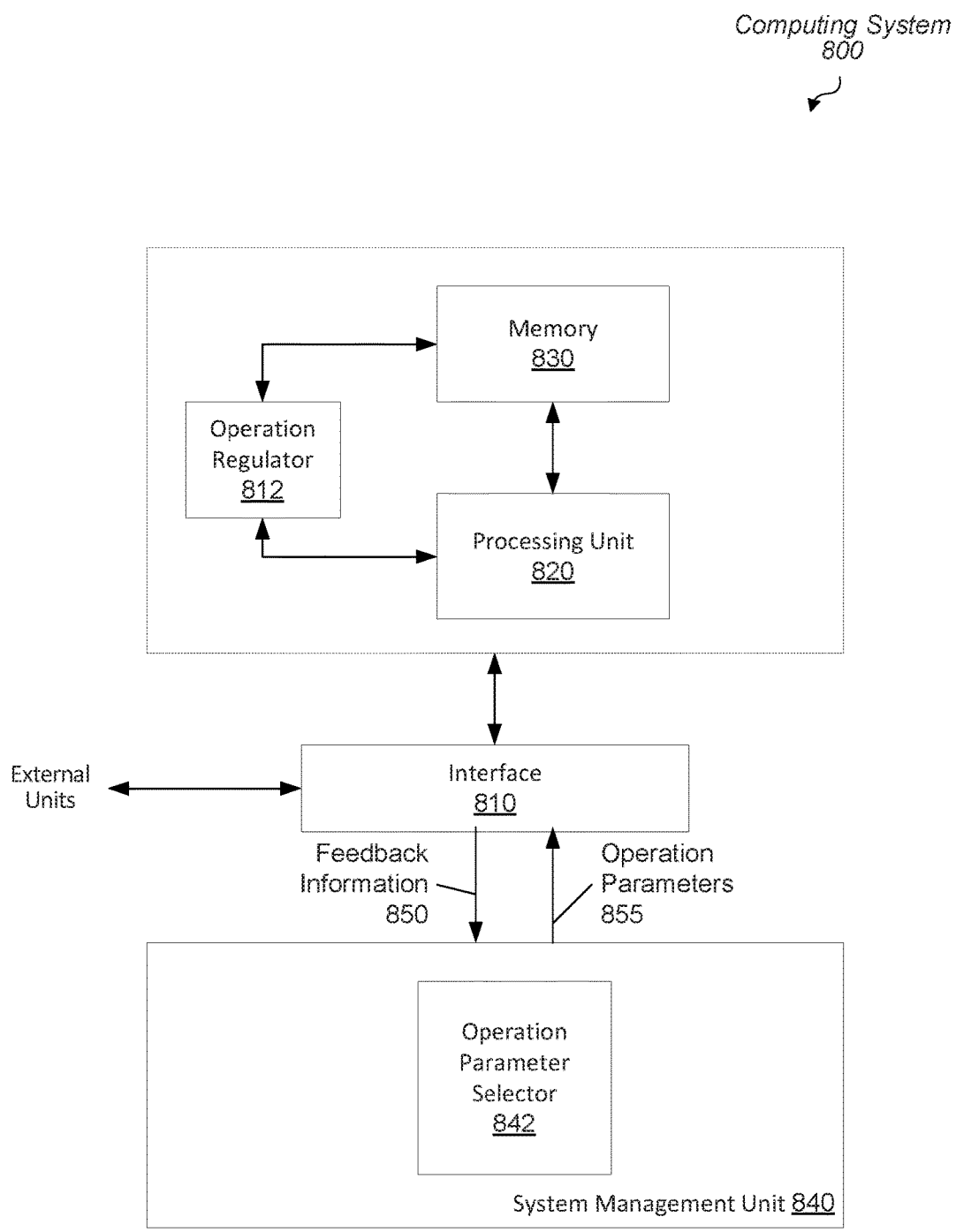
FIG. 8 is a generalized block diagram of one embodiment of a computing system.

Turning now to FIG. 8, one embodiment of a computing system 800 is shown. As shown, the computing system 800 includes a processing unit 820, a memory 830, an interface 810, an operation regulator 812 and a system management unit 840. In some embodiments, the functionality of the computing system 800 is included as components on a single die, such as a single integrated circuit. In other embodiments, the functionality of the computing system 800 is included as multiple dies on a system-on-a-chip (SOC). In various embodiments, the computing system 800 is used in a desktop, a portable computer, a mobile device, a server, a peripheral device, or otherwise.

The components of the computing system 800 are capable of using both planar devices (transistors) and non-planar devices. In various embodiments, the interface 810 is used to communicate with other components such as a memory controller, a network interface card (NIC), peripheral devices, and so forth, which are not shown for ease of illustration. The interface unit 810 is also used to transfer messages, data and control signals between the system management unit 840 and each of the processing unit 820 and the memory 830. The control logic in the interface 810 operates according to communication protocols corresponding to each unit transferring information with it.

The processing unit 820 processes instructions of a predetermined algorithm. The processing includes fetching instructions and data, decoding instructions, executing instructions and storing results. In some embodiments, the processing unit 820 is a general-purpose microprocessor. In other embodiments, the processing unit 820 is an application specific integrated circuit (ASIC). In yet other embodiments, the processing unit is a single-instruction-multiple-data (SIMD) microarchitecture processor. In still further embodiments, the processing unit 820 includes the functionality of two or more different architectures such as a general-purpose central processing unit (CPU) and a SIMD processor such as a graphics processing unit (GPU). While processing instructions, the processing unit 820 performs calculations and generates memory access requests for retrieving instructions and operand data and for storing result data.

In various embodiments, memory 830 represents an entirety of a memory system, a portion of a memory system, is at least a portion of a cache hierarchy, comprises a random access memory, or otherwise. These and other embodiments are possible and are contemplated. In yet other embodiments, the memory 830 is a structure embedded within the processing unit 820. For example, the memory 830 may be a patch RAM, a branch instruction prediction table, any of a variety of internal caches (e.g., a translation lookaside buffer, an on-die data or instruction cache), and so on. In various embodiments, the memory 830 includes access control logic in a control unit and an array of memory bit cells arranged in rows and columns. Each of the memory bit cells includes a latching element and a precharging portion for driving values on differential bit lines. In various embodiments, the memory 830 includes dummy cells, such as the dummy cell 500 described earlier. In some embodiments, the dummy cells are placed between two regions as described earlier. The memory 830 is accessed for the fetching operations and the generated memory access requests, which include storing results. Although a single memory is shown, in various embodiments, multiple memories are used in the computing system 800.

In various embodiments, one or more of the processing unit 820 and the memory 830 receives operating parameters from the operation regulator 812 for operating both logic and circuitry. The operating parameters include at least a combination of an operational frequency and an operational voltage. In some embodiments, one or more of the processing unit 820 and the memory 830 sends feedback information 850 to the operation parameter selector 842 within the system management unit 840. Based on at least the feedback information 850, the operation parameter selector 842 generates control signals and values indicating the operating parameters 855 to be supplied by the operation regulator 812 to the processing unit 820 and the memory 830. Although a single operation regulator 812 is shown, in some embodiments, each of the processing unit 820 and the memory 830 is coupled to a separate and respective operational regulator.

In some embodiments, a power target, such as the thermal design power (TDP), is assigned to the combination of the processing unit 820 and the memory 830. For example, such a TDP may be established based on a determination that the cooling system is able to dissipate the TDP value without exceeding the maximum junction temperature for transistors. In some embodiments, the system management unit 840 associates a total number of power credits with the TDP value and allocates a separate number of power credits to each of the processing unit 820 and the memory 830. A sum of the power credits allocated to the various units generally equals the total number of power credits. Although embodiments where the sum may temporarily exceed the TDP are possible and are contemplated.

In various embodiments, the system management unit 840 adjusts the number of power credits for each of the processing unit 820 and the memory 830 based on the received feedback information 850. Examples of the feedback information 850 are monitored usage information of the processing unit 820 and the memory 830 in addition to on-die sensor values. In some embodiments, the monitored usage information includes one or more of the power credits, weighted activity levels, weighted usage of pre-selected signals, and digital temperature or power calculated values. In some embodiments, one or more of the other examples of the feedback information 850 are converted to power credits within the system management unit 840.

Examples of the on-die sensor values are on-die temperature readings and on-die drawn current readings. In some embodiments, the operation parameter selector 842 receives the feedback information 850 with a known frequency. For example, information is sampled and sensed, calculations are performed and the results are sent to the operation parameter selector 842 during a given time interval. The determination of the time interval is based on a combination of the desired accuracy and confidence of the feedback information 850, and desired results from updated operating parameters 855 found from analysis including simulations and/or executions during production.

In some embodiments, the operation parameter selector 842 determines a combination of operational voltage and clock frequency for the processing unit 820 and the memory 830. In some embodiments, each of the processing unit 820 and the memory 830 use a separate combination of operational voltage and clock frequency. In other embodiments, each of the processing unit 820 and the memory 830 uses a same combination of operational voltage and clock frequency. The combination of operational voltage and clock frequency is referred to as a power-performance state (P-state).

While running one or more software applications, the real-time feedback information 850 is conveyed to the operation parameter selector 842, which balances reduced power consumption and increased performance for the computing system 800. In one embodiment, the operation parameter selector 842 selects one discrete power-performance state (P-state) from several given discrete P-states.

The P-state selected by the operation parameter selector 842 is between a maximum performance state and a minimum power state. The maximum performance state includes a maximum operating clock frequency and a maximum operational voltage, whereas the minimum power state includes a minimum operating clock frequency and a minimum operational voltage. The intermediate discrete power-performance states (P-states) include given scaled values for a combination of the operating frequency and the operational voltage. Each of the discrete P-states is associated with an operating mode, which is also referred to as an operating state. The operating mode is selected by the operation parameter selector 842 using design limits set by at least a thermal design power (TDP) and prevention of memory access failures. In some embodiments, two examples of the operating states are the awake state and the sleep state for regions within the memory 830. In other embodiments, control logic within the memory 830 receives one or more of the operation parameters 855 and determines the awake state and the sleep state for regions within the memory 830 based on the received operation parameters. In yet other embodiments, control logic within the memory 830 determines the awake state and the sleep state for regions within the memory 830 independent of the operation parameters 855.

It is noted that one or more of the above-described embodiments include software. In such embodiments, the program instructions that implement the methods and/or mechanisms are conveyed or stored on a computer readable medium. Numerous types of media which are configured to store program instructions are available and include hard disks, floppy disks, CD-ROM, DVD, flash memory, Programmable ROMs (PROM), random access memory (RAM), and various other forms of volatile or non-volatile storage. Generally speaking, a computer accessible storage medium includes any storage media accessible by a computer during use to provide instructions and/or data to the computer. For example, a computer accessible storage medium includes storage media such as magnetic or optical media, e.g., disk (fixed or removable), tape, CD-ROM, or DVD-ROM, CD-R, CD-RW, DVD-R, DVD-RW, or Blu-Ray. Storage media further includes volatile or non-volatile memory media such as RAM (e.g. synchronous dynamic RAM (SDRAM), double data rate (DDR, DDR2, DDR3, etc.) SDRAM, low-power DDR (LPDDR2, etc.) SDRAM, Rambus DRAM (RDRAM), static RAM (SRAM), etc.), ROM, Flash memory, non-volatile memory (e.g. Flash memory) accessible via a peripheral interface such as the Universal Serial Bus (USB) interface, etc. Storage media includes microelectromechanical systems (MEMS), as well as storage media accessible via a communication medium such as a network and/or a wireless link.

Additionally, in various embodiments, program instructions include behavioral-level descriptions or register-transfer level (RTL) descriptions of the hardware functionality in a high level programming language such as C, or a design language (HDL) such as Verilog, VHDL, or database format such as GDS II stream format (GDSII). In some cases the description is read by a synthesis tool, which synthesizes the description to produce a netlist including a list of gates from a synthesis library. The netlist includes a set of gates, which also represent the functionality of the hardware including the system. The netlist is then placed and routed to produce a data set describing geometric shapes to be applied to masks. The masks are then used in various semiconductor fabrication steps to produce a semiconductor circuit or circuits corresponding to the system. Alternatively, the instructions on the computer accessible storage medium are the netlist (with or without the synthesis library) or the data set, as desired. Additionally, the instructions are utilized for purposes of emulation by a hardware based type emulator from such vendors as Cadence®, EVE®, and Mentor Graphics®.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A computing system comprising:
    a memory comprising a dummy cell between a first region and a second region, wherein the dummy cell uses comprises a first ground connection and a dummy ground connection, wherein the first ground connection is used by the first region and is not used by the second region, and the dummy ground connection is not used by either of the first region or the second region two ground connections comprising at least a dummy ground connection not used by either the first region or the second region; and
    an operation regulator configured to:
    select an awake ground reference voltage for the first ground connection used by the first region, in response to receiving an indication of an awake state for the first region; and
    select a sleep ground reference voltage different from the awake ground reference voltage for the first ground connection, in response to receiving an indication of a sleep state for the first region.

2. The computing system as recited in claim 1, wherein the dummy ground connection is a floating node.

3. The computing system as recited in claim 1, wherein the dummy cell is a memory cell with a word line connected to a first ground reference voltage.

4. The computing system as recited in claim 3, wherein the first ground reference is zero.

5. The computing system as recited in claim 1, wherein the operation regulator is configured to:
    select the awake ground reference voltage for a second ground connection used by the second region, in response to receiving an indication of the awake state for the second region; and
    select the sleep ground reference voltage for the second ground connection, in response to receiving an indication of the sleep state for the second region.

6. The computing system as recited in claim 1, wherein the awake ground reference voltage is zero and the sleep ground reference voltage is between zero and a power supply value voltage used by the plurality of memory cells.

7. A method comprising:
  storing data in a memory, wherein the memory comprises a dummy cell between a first region and a second region, wherein the dummy cell comprises a first ground connection and a dummy ground connection, wherein the first ground connection is used by the first region and is not used by the second region, and the dummy ground connection is not used by either of the first region or the second region uses two ground connections comprising at least a dummy ground connection not used by either the first region or the second region;
  selecting an awake ground reference voltage for the first ground connection used by the first region, in response to receiving an indication of an awake state for the first region; and
  selecting a sleep ground reference voltage different from the awake ground reference voltage for the first ground connection, in response to receiving an indication of a sleep state for the first region.

8. The method as recited in claim 7, wherein the dummy ground connection is a floating node.

9. The method as recited as in the claim 7, wherein the dummy cell is a memory cell with a word line connected to a first ground reference voltage.

10. The method as recited in claim 9, wherein the first ground reference voltage is zero.

11. The method as recited in claim 7, further comprising:
  selecting the awake ground reference voltage for a second ground connection used by the second region, in response to receiving an indication of the awake state for the second region; and
  selecting the sleep ground reference voltage for the second ground connection, in response to receiving an indication of the sleep state for the second region.

12. The method as recited in claim 7, wherein the awake ground reference voltage is zero and the sleep ground reference voltage is between zero and a power supply value voltage used by the plurality of memory cells.

13. A memory comprising:
  an array comprising a dummy cell between a first region and a second region, wherein the dummy cell comprises a first ground connection and a dummy ground connection, wherein the first ground connection is used by the first region and is not used by the second region, and the dummy ground connection is not used by either of the first region or the second region uses two ground connections comprising at least a dummy ground connection not used by either the first region or the second region;
  a control unit coupled to the array, wherein the control unit is configured to:
  execute access requests for the data stored in the array, in response to receiving the access requests;
  select an awake ground reference voltage for a first ground connection used by the first region, in response to receiving an indication of an awake state for the first region; and
  select a sleep ground reference voltage different from the awake ground reference voltage for the first ground connection, in response to receiving an indication of a sleep state for the first region.

14. The memory as recited in claim 13, wherein the dummy ground connection is a floating node.

15. The memory as recited in claim 13, wherein the dummy cell is a memory cell with a word line connected to a first ground reference voltage.

16. The memory as recited in claim 15, wherein the first ground reference voltage is zero.

17. The memory as recited in claim 13, wherein the awake ground reference voltage is zero and the sleep ground reference voltage is between zero and a power supply value used by the plurality of memory cells.

* * * * *

UNITED STATES PATENT AND TRADEMARK OFFICE
CERTIFICATE OF CORRECTION

PATENT NO. : 10,043,572 B1
APPLICATION NO. : 15/663096
DATED : August 7, 2018
INVENTOR(S) : Schreiber et al.

Page 1 of 1

It is certified that error appears in the above-identified patent and that said Letters Patent is hereby corrected as shown below:

In the Claims

Column 14, Claim 4, Line 54, please delete "reference is zero" and substitute -- reference voltage is zero --.

Column 15, Claim 9, Line 23, please delete "as in the claim 7" and substitute -- in claim 7 --.

Signed and Sealed this
Twenty-ninth Day of January, 2019

Andrei Iancu
*Director of the United States Patent and Trademark Office*